(12) United States Patent
Huang et al.

(10) Patent No.: US 11,264,065 B2
(45) Date of Patent: Mar. 1, 2022

(54) DATA TRANSCEIVER DEVICE AND OPERATION METHOD THEREOF

(71) Applicant: REALTEK SEMICONDUCTOR CORPORATION, Hsinchu (TW)

(72) Inventors: Zhen-Ting Huang, Hsinchu (TW); Chun-Hao Lin, Hsinchu (TW); Er-Zih Wong, Hsinchu (TW); Shih-Chiang Chu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/073,434

(22) Filed: Oct. 19, 2020

(65) Prior Publication Data
US 2021/0125646 A1 Apr. 29, 2021

(30) Foreign Application Priority Data

Oct. 23, 2019 (TW) ................... 108138234

(51) Int. Cl.
*G11C 7/10* (2006.01)
*G11C 7/22* (2006.01)

(52) U.S. Cl.
CPC .......... *G11C 7/1084* (2013.01); *G11C 7/1048* (2013.01); *G11C 7/1057* (2013.01); *G11C 7/222* (2013.01)

(58) Field of Classification Search
CPC ................................ G11C 7/1084; G11C 7/10
USPC ......................................... 365/189.05, 189.5
See application file for complete search history.

(56) References Cited

U.S. PATENT DOCUMENTS

| | | | | |
|---|---|---|---|---|
| 5,566,109 A | * | 10/1996 | Matsubara | ............. G11C 16/10 365/185.08 |
| 6,275,436 B1 | * | 8/2001 | Tobita | .................. G06F 3/0616 365/221 |
| 10,762,017 B2 | | 9/2020 | Chu et al. | |
| 2003/0021138 A1 | * | 1/2003 | Keeth | ................. G11C 11/4074 365/63 |

OTHER PUBLICATIONS

"Data Transmission Method and Data Transmission System", TW 108113259 ; Filing date:Apr. 16, 2019 (YYYY-MM-DD).
"Data Transmission Method and Data Transmission System", U.S. Appl. No. 16/838,202, filed Apr. 2, 2020 (YYYY-MM-DD).

* cited by examiner

*Primary Examiner* — Muna A Techane
(74) *Attorney, Agent, or Firm* — WPAT, PC

(57) ABSTRACT

A data transceiver device and an operation method are provided. The data transceiver device receives input data and transmits output data. The data transceiver device includes a buffer circuit, a storage circuit, a timing circuit and a control circuit. The buffer circuit is configured to store input data. The storage circuit is configured to store the output data. The timing circuit is configured to generate a time-out signal according to the set time. The control circuit is configured to process the input data to generate the output data, to store the output data in the storage circuit, and to transmit the output data according to an output data threshold value and the time-out signal. The control circuit adjusts the set time and/or the output data threshold value based on an initial condition and the state of the buffer circuit.

19 Claims, 8 Drawing Sheets

DATA TRANSCEIVER DEVICE AND OPERATION METHOD THEREOF

BACKGROUND OF THE INVENTION

1. Field of the Invention

The present disclosure generally relates to electronic devices, and, more particularly, to a data transceiver device and its operation methods.

2. Description of Related Art

FIG. 1 is a functional block diagram of a conventional electronic device 100. The electronic device 100 includes a host 110, a data transceiver device 120 and a data transmission interface 130. The data transceiver device 120 receives the input data Din and transmits the output data Dout to the host 110 through the data transmission interface 130. In some embodiments, the data transmission interface 130 is a Universal Serial Bus (USB), USB type-C, Thunderbolt, secure digital input/output (SDIO) or the like. In order to improve the transmission efficiency (e.g., the data throughput), the data transceiver device 120 often outputs the output data Dout in batches. In other words, the data transceiver device 120 accumulates the output data Dout and then transmits the accumulated output data Dout in a single transmission when the accumulated output data Dout exceeds the threshold value or when a preset time has just elapsed (i.e., time-out).

The threshold value and the preset time play important roles in the performance of the electronic device 100. A threshold value that is too large hinders the host 110 from receiving the data timely, and a threshold value that is too small lowers the transmission efficiency (i.e., low bandwidth utilization rate). The threshold value is hard to design due to its high dependence on the memory size of the host 110, in which the memory size is not standardized. In addition, the settings of the preset time and the threshold value are also dependent on the variety of the host 110 and the data transmission interface 130, e.g., USB2.0, USB3.0, or USB type-C. As a result, adaptive adjustments on the threshold value and the preset time are crucial to the performance of the electronic device.

SUMMARY OF THE INVENTION

In view of the issues of the prior art, an object of the present disclosure is to provide a data transceiver device and its operation methods, so as to improve the performance of an electronic device.

A data transceiver device for receiving an input data and transmitting an output data is provided. The data transceiver device includes a buffer circuit, a storage circuit, a timing circuit and a control circuit. The buffer circuit is configured to store the input data. The storage circuit is configured to store the output data. The timing circuit is configured to generate a time-out signal based on a set time. The control circuit is configured to process the input data to generate the output data, to store the output data in the storage circuit, and to transmit the output data based on an output data threshold value and the time-out signal. The control circuit adjusts the set time and/or the output data threshold value based on an initial condition and a state of the buffer circuit. The initial condition may be related to the type of a data transmission interface, to whether there is a hub on the data transmission interface, to the data flow of an output data and/or the amount of the output data per unit time, and/or to the data flow of an input data and/or the amount of the input data per unit time. The state of the buffer circuit may refer to the size of the remaining or available space of the buffer circuit and/or whether the size of the remaining or available space of the buffer circuit is less than or greater than a threshold value.

An operation method of a data transceiver device is provided. The data transceiver device includes a buffer circuit and a storage circuit. The operation method includes the following steps: receiving an input data and storing the input data in the buffer circuit; processing the input data to generate an output data; storing the output data in the storage circuit; generating a time-out signal based on a set time; transmitting the output data based on an output data threshold value and the time-out signal; and adjusting the set time and/or the output data threshold value based on an initial condition and a state of the buffer circuit.

A network interface card for receiving an input data and transmitting an output data is provided. The network interface card includes a buffer circuit, a storage circuit, a timing circuit and a control circuit. The buffer circuit is configured to store the input data. The storage circuit is configured to store the output data. The timing circuit is configured to generate a time-out signal. The control circuit is configured to process the input data to generate the output data, to store the output data in the storage circuit, and to transmit the output data based on the time-out signal. The control circuit adjusts a pause packet transmission timing parameter based on an initial condition and a state of the buffer circuit.

According to this disclosure, the data transceiver device and its operation methods can adaptively adjust the data transmission parameters for various environments to improve the transmission efficiency. In comparison with the conventional technology, the data transceiver device and its operation methods provided in this disclosure have the adaptive adjustment capability, which saves the circuit designers a lot of human resources in the customization for various hardware specifications and/or application environments.

These and other objectives of the present disclosure no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes a data transceiver device and its operation method. On account of that some or all elements of the data transceiver device could be known, the detail of such elements is omitted provided that such detail has little to do with the features of this disclosure, and that this omission nowhere dissatisfies the specification and enablement requirements. Some or all of the processes of the operation methods of the data transceiver device may be implemented by software and/or firmware and can be performed by the data transceiver device or its equivalent. A person having ordinary skill in the art can choose components or steps equivalent to those described in this specification to carry out the present disclosure, which means that the scope of this disclosure is not limited to the embodiments in the specification.

Figure 1:
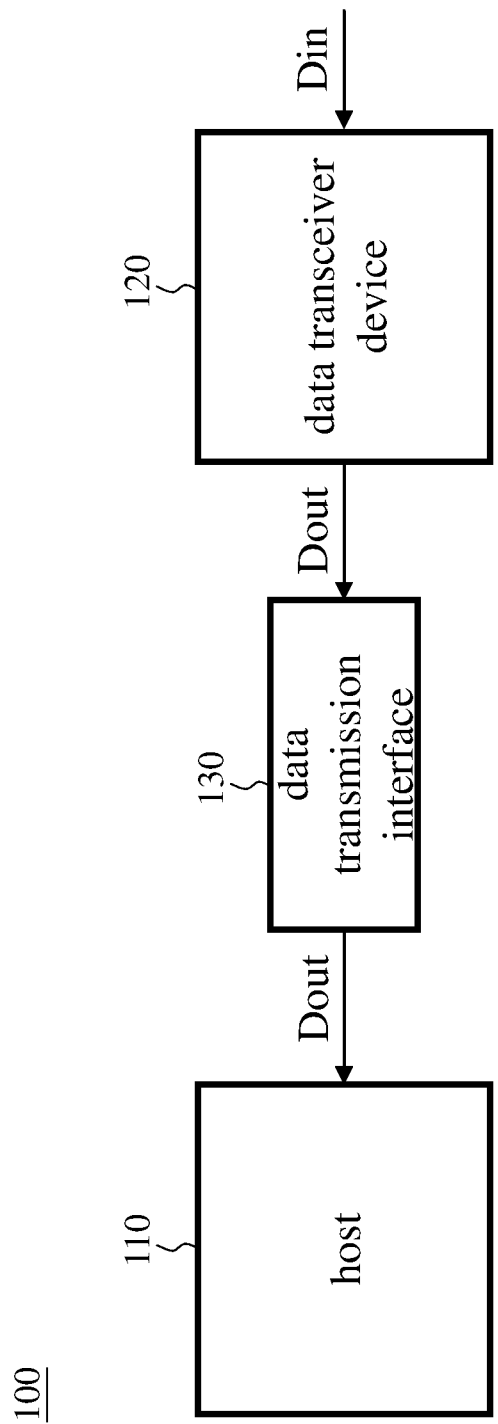
FIG. 1 illustrates a functional block diagram of a conventional electronic device.
Figure 2:
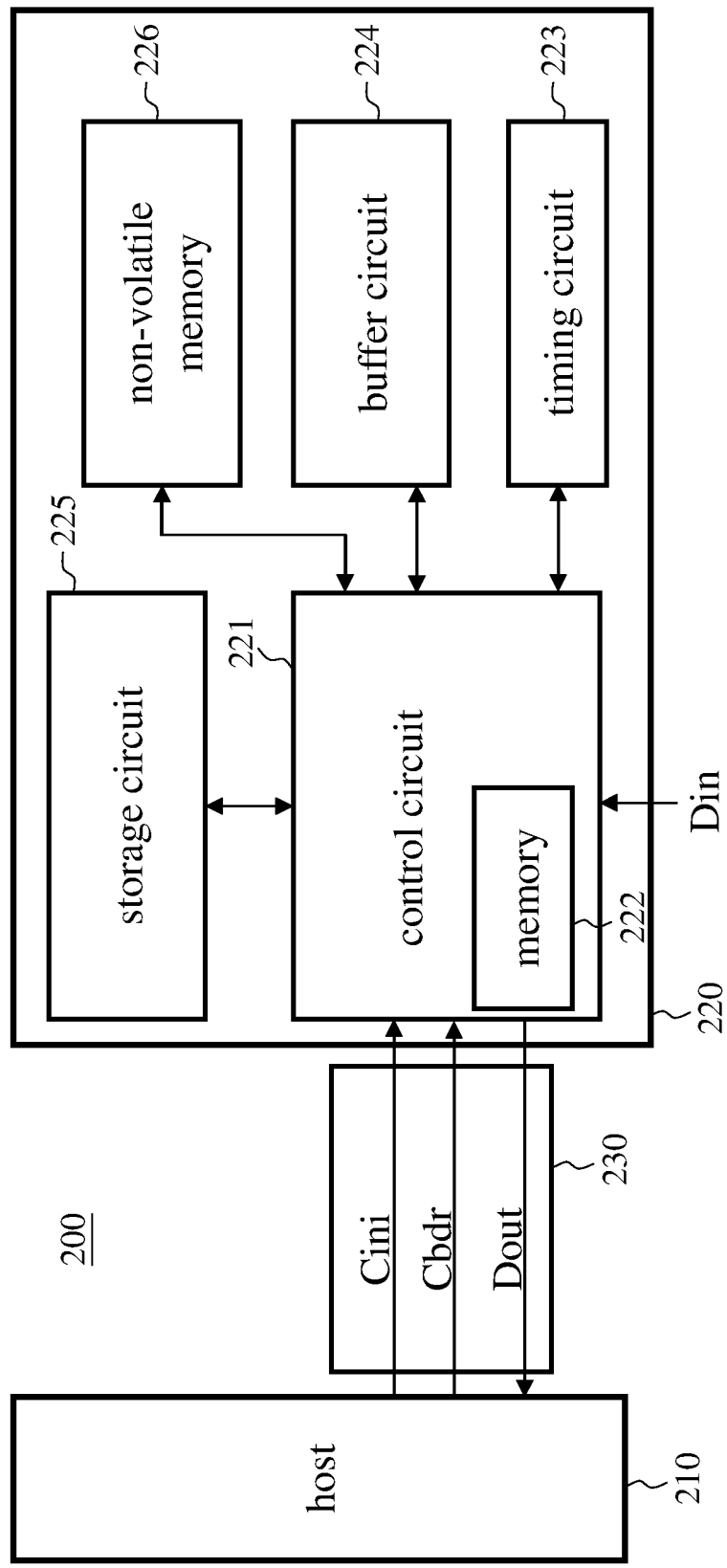
FIG. 2 illustrates a functional block diagram of an electronic device according to an embodiment of this disclosure.
Figure 3:
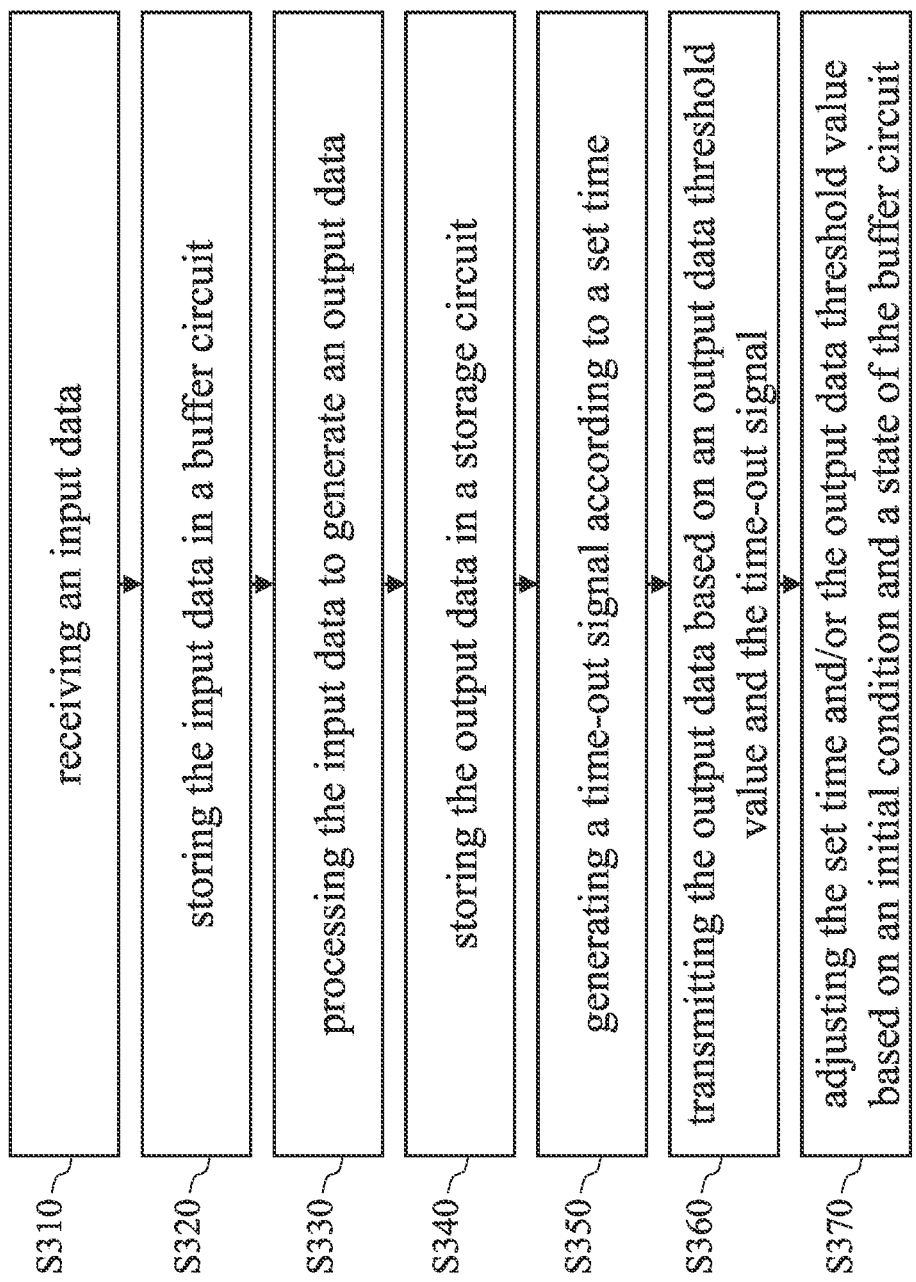
FIG. 3 illustrates a flowchart of an operation method of a data transceiver device according to an embodiment of this disclosure.

FIG. 2 is a functional block diagram of an electronic device according to an embodiment of this disclosure. The electronic device 200 includes a host 210, a data transceiver device 220 and a data transmission interface 230. The data transceiver device 220 includes a control circuit 221, a memory 222, a timing circuit 223, a buffer circuit 224, a storage circuit 225 and a non-volatile memory 226. FIG. 3 is a flowchart of an operation method of a data transceiver device according to an embodiment of this disclosure. Reference is made to FIGS. 2 and 3 for the following discussions.

The control circuit 221 receives the input data Din (step S310) and stores the input data Din in the buffer circuit 224 (step S320). The buffer circuit 224 can be a first-in first-out (FIFO) register or memory. The control circuit 221 then processes the input data Din to generate the output data Dout (step S330). For example, when the data transceiver device 220 is a network interface card (NIC), the input data Din can be a network packet containing a header, and the output data Dout can be the content of the network packet. In other words, the processing in step S330 includes setting the corresponding parameter or value at the specific header position. After generating the output data Dout, the control circuit 221 stores the output data Dout in the storage circuit 225 (step S340). In some embodiments, the storage circuit 225 may be implemented by the dynamic random access memory (DRAM). The timing circuit 223 is configured to generate a time-out signal according to the set time (step S350), and the control circuit 221 transmits the output data Dout to the host 210 based on an output data threshold value and the time-out signal (step S360). The set time may be stored in a register (not shown) of the timing circuit 223 and/or in the non-volatile memory 226, and the output data threshold value may be stored in the memory 222 and/or the non-volatile memory 226. The control circuit 221 adjusts the set time and/or the output data threshold value based on an initial condition and a state of the buffer circuit 224 (step S370).

In some embodiments, the initial condition (such as the initial condition Cini in FIG. 2) is provided or set by the host 210, and the data transceiver device 220 may store the initial condition Cini in the memory 222 or the non-volatile memory 226. In some embodiments, the initial condition Cini may be related to the type of the data transmission interface 230, to whether there is a hub on the data transmission interface 230, to the data flow of the output data Dout and/or the amount of the output data Dout per unit time, and/or to the data flow of the input data Din and/or the amount of the input data Din per unit time. If the hub has a memory, the size of the memory is also a factor in the efficiency of the data transmission between the host 210 and the data transceiver device 220.

Figure 4:
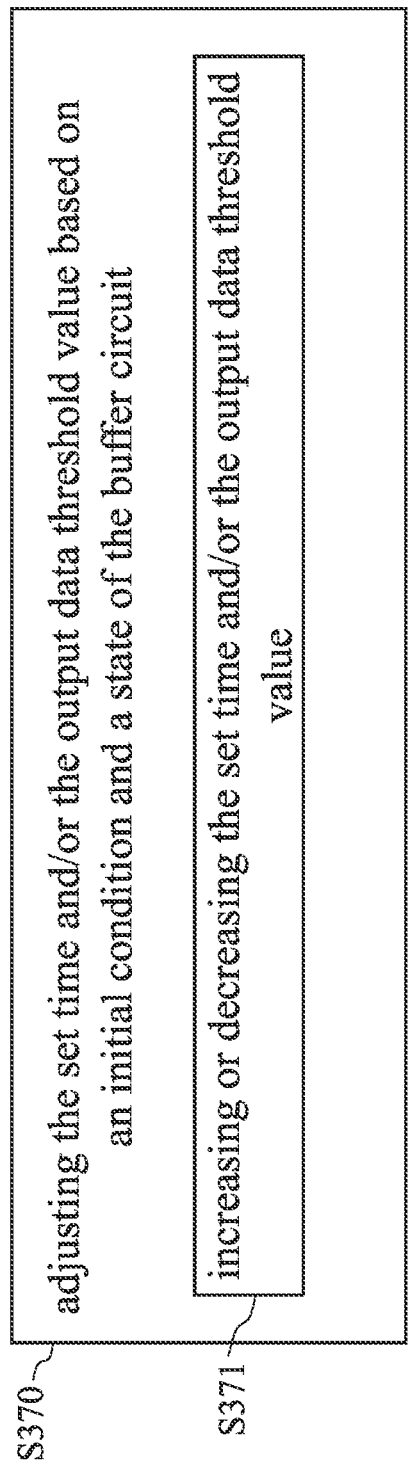
FIG. 4 illustrates details of step S370 in FIG. 3.

FIG. 4 shows details of step S370 in FIG. 3. When adjusting the set time and/or the output data threshold value, the control circuit 221 may increase or decrease the set time and/or the output data threshold value (step S371). In some embodiments, the control circuit 221 monotonically increases or decreases the set time and/or the output data threshold value. In other words, the control circuit 221 adjusts the set time and/or the output data threshold value towards one direction to reduce the complexity of the circuit.

Figure 5:
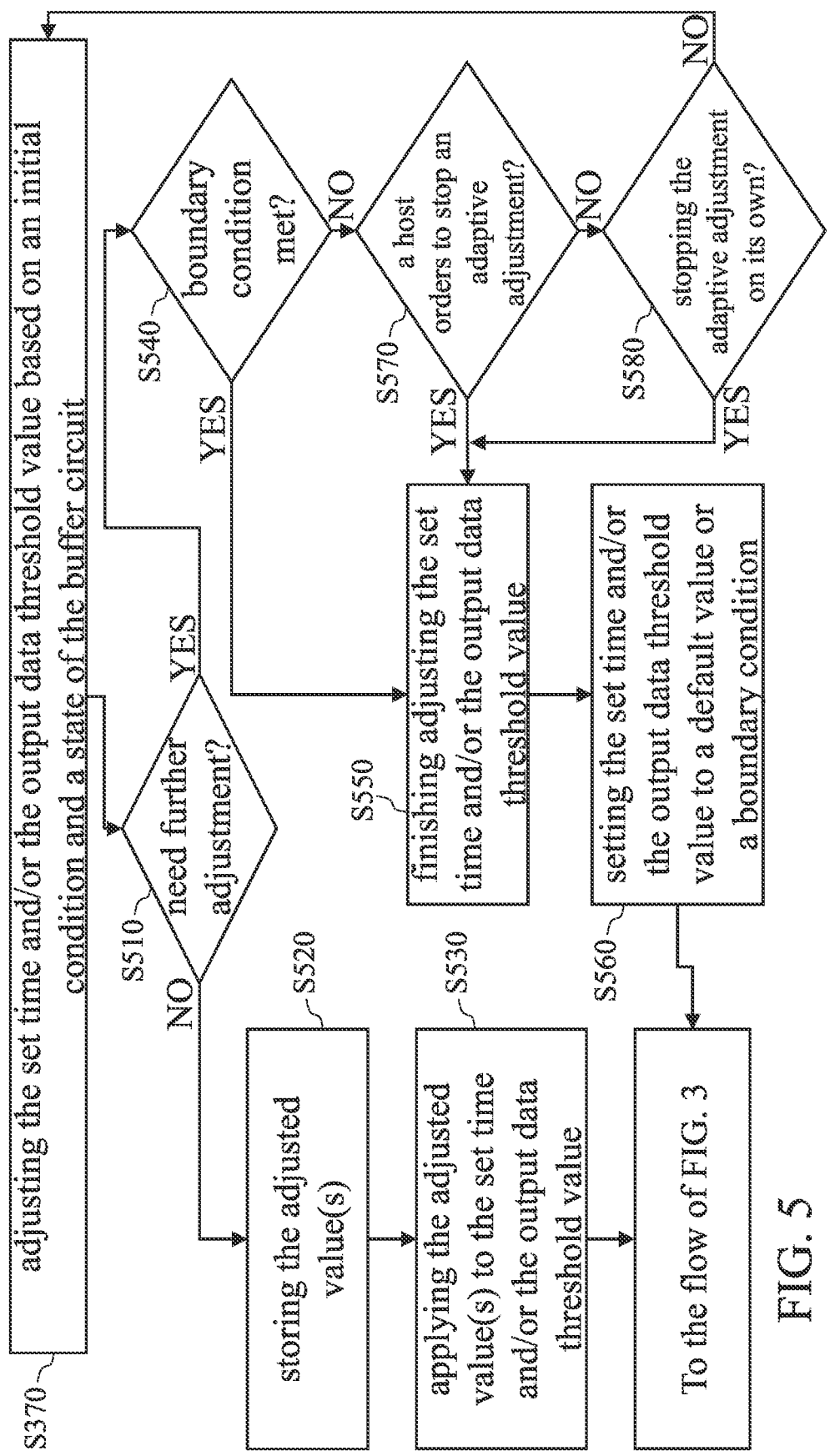
FIG. 5 illustrates a flowchart of an operation method of a data transceiver device according to an embodiment of this disclosure.

FIG. 5 is a flowchart of an operation method of a data transceiver device according to an embodiment of this disclosure. Following step S370 in FIG. 3, after one adjustment on the set time and/or the output data threshold value (e.g., to increase or decrease by a step value), the control circuit 221 determines whether a further adjustment on the set time and/or the output data threshold value is needed (step S510). In some embodiments, if packet loss no longer occurs after the adjustment, the control circuit 221 determines that no further adjustment is needed (i.e., NO branch in step S510). Packet loss means that the data transceiver device 220 can receive no more input data Din as a result of the buffer circuit 224 being full. In some embodiments, the control circuit 221 may store the number of lost packets in the memory 222 and may adjust the set time and/or the output data threshold value based on the number of lost packets. For example, if the number of lost packets becomes smaller as a result of an increase (or decrease) in the set time and/or the output data threshold value, the control circuit 221 continues to increase (or decrease) the set time and/or the output data threshold value in the next adjustment. On the contrary, if the number of lost packets becomes larger as a result of an increase (or decrease) in the set time and/or the output data threshold value, the control circuit 221 decreases (or increases) the set time and/or the output data threshold value in the next adjustment.

In other embodiments, step S510 determines whether a further adjustment on the set time and/or the output data threshold value is needed based on the size of the remaining or available space of the buffer circuit 224. More specifically, if the remaining or available space of the buffer circuit 224 becomes larger as a result of an increase (or decrease) in the set time and/or the output data threshold value, the control circuit 221 continues to increase (or decrease) the set time and/or the output data threshold value in the next adjustment. On the contrary, if the remaining or available space of the buffer circuit 224 becomes less as a result of an increase (or decrease) in the set time and/or the output data threshold value, the control circuit 221 decreases (or increases) the set time and/or the output data threshold value in the next adjustment.

When step S510 is negative, the control circuit 221 may store the adjusted value(s) (i.e., the adjusted set time and/or the adjusted output data threshold value) in the non-volatile memory 226 (step S520), applies the adjusted value(s) to the set time and/or the output data threshold value (step S530), and then returns to FIG. 3 to proceed to perform steps S310 to S370.

When step S510 is positive, the control circuit 221 checks whether the adjusted value(s) meets the boundary condition (step S540). If the adjusted value(s) meets or exceeds the boundary condition, step S540 is determined positive; otherwise, negative.

In some embodiments, the boundary condition (such as the boundary condition Cbdr in FIG. 2) is provided or set by the host 210, and the data transceiver device 220 may store the boundary condition Cbdr in the memory 222 or the non-volatile memory 226. In other embodiments, the non-volatile memory 226 stores a lookup table for the boundary conditions, and the control circuit 221 may, based on the type of the data transmission interface 230 or on the data flow of the output data Dout and/or the input data Din and/or on the amount of the output data Dout and/or the input data Din per unit time, search the lookup table for the boundary condition that is suitable for the circumstances at the time.

In some embodiments, the boundary condition Cbdr may be related to the type of the data transmission interface 230, to whether there is a hub on the data transmission interface 230, to the data flow of the output data Dout and/or the amount of the output data Dout per unit time, and/or to the data flow of the input data Din and/or the amount of the input data Din per unit time.

If the boundary condition is met (YES branch in step S540), the control circuit 221 finishes adjusting the set time and/or the output data threshold value (step S550), and sets the set time and/or the output data threshold value to the default value or the boundary condition (step S560). The default value is, for example, unadjusted set time and/or an unadjusted output data threshold value and can be stored in the non-volatile memory 226. After step S560 finishes, the control circuit 221 proceeds to perform steps S310 to S370 in FIG. 3.

If the boundary condition is not met (NO branch in step S540), the control circuit 221 determines whether the adaptive adjustment should be stopped (step S570 or S580). In step S570, the host 210 controls the stop of the adaptive adjustment, whereas in step S580, the data transceiver device 220 determines whether to stop the adaptive adjustment on its own. In some embodiments, step S580 can be performed before step S570. In some embodiments, steps S570 and S580 can be performed simultaneously. When step S570 or step S580 is positive, the control circuit 221 performs step S550 and step S560 and then proceeds to perform steps S310 to S370 in FIG. 3. When both step S570 and step S580 are negative, the control circuit 221 continues the adjustment on the set time and/or the output data threshold value (step S370). The host 210 determines whether to control the data transceiver device 220 to stop the adaptive adjustment based on the change in the environment of the electronic device 200 (taking a USB NIC as an example, the change might be one or more of the following: the central processing unit (CPU) of the host 210 entering or leaving "C state ratio," the NIC enabling/disabling the jumbo frame, the host 210 entering the U1/U2 ratio, etc.) and/or the state of the data transmission interface 230 (e.g., the strength of the wireless USB WiFi signal, the severeness of the interference from the cable electromagnetic wave, or whether the USB hub supports the multiple transaction translator (multi-TT)). The control circuit 221 may determine whether to stop the adaptive adjustment based on the circuit state of the data transceiver device 220 (e.g., if the circuit state has entered an unexpected state, the circuit state has caused excessive power consumption/heat to the overall system operation, or the circuit state is stuck in an infinite loop and cannot stop) and/or the state of the data transmission interface 230.

Figure 6:
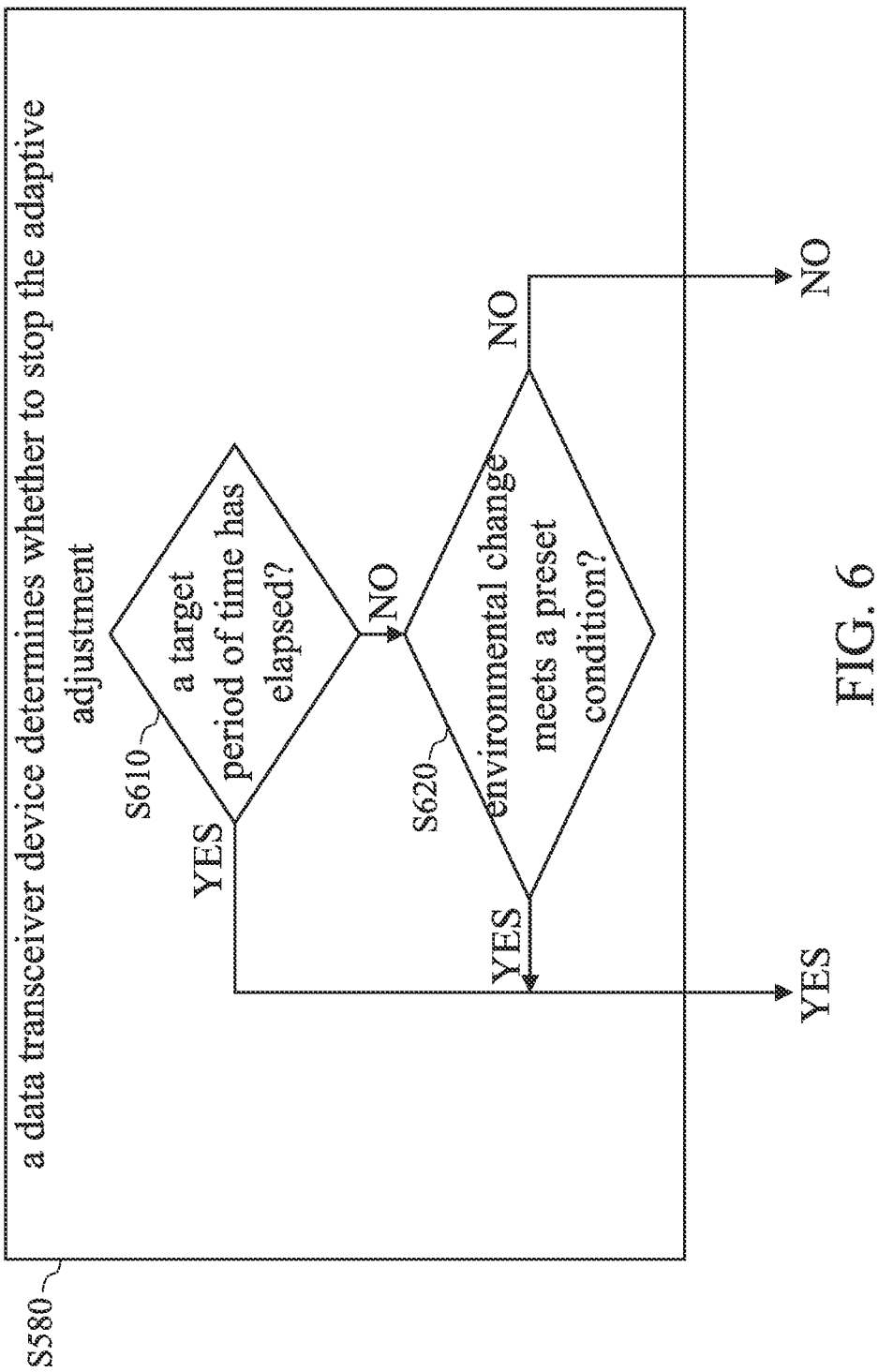
FIG. 6 illustrates a flowchart of one embodiment of step S580 in FIG. 5.

FIG. 6 illustrates a flowchart of one embodiment of step S580 in FIG. 5. In this embodiment, the control circuit 221 determines whether the adaptive adjustment has been carrying on for a target period of time (step S610) and/or whether the environmental change meets a preset condition (step S620). When either step S610 or step S620 is positive, the control circuit 221 stops the adaptive adjustment process of the data transceiver device 220 (i.e., step S580 being determined positive). When step S610 and step S620 are both negative, the control circuit 221 continues to perform the adaptive adjustment process of the data transceiver device 220 (i.e., step S580 being determined negative). In some embodiments, step S620 can be performed before step S610. In some embodiments, step S620 and step S610 can be performed simultaneously. The target period of time can be set by the user to any value. A shorter target period of time can prevent the data transceiver device 220 from consuming too much power in the adaptive adjustment process. The preset condition for the environmental change may include the state of the data transceiver device 220 (such as changes in the parameters of thermal or power consumption), the state of the data transmission interface 230 and/or the state of the host 210 (such as the suspend state, the always on always connected (AOAC) state, or the battery mode, etc.).

Figure 7:
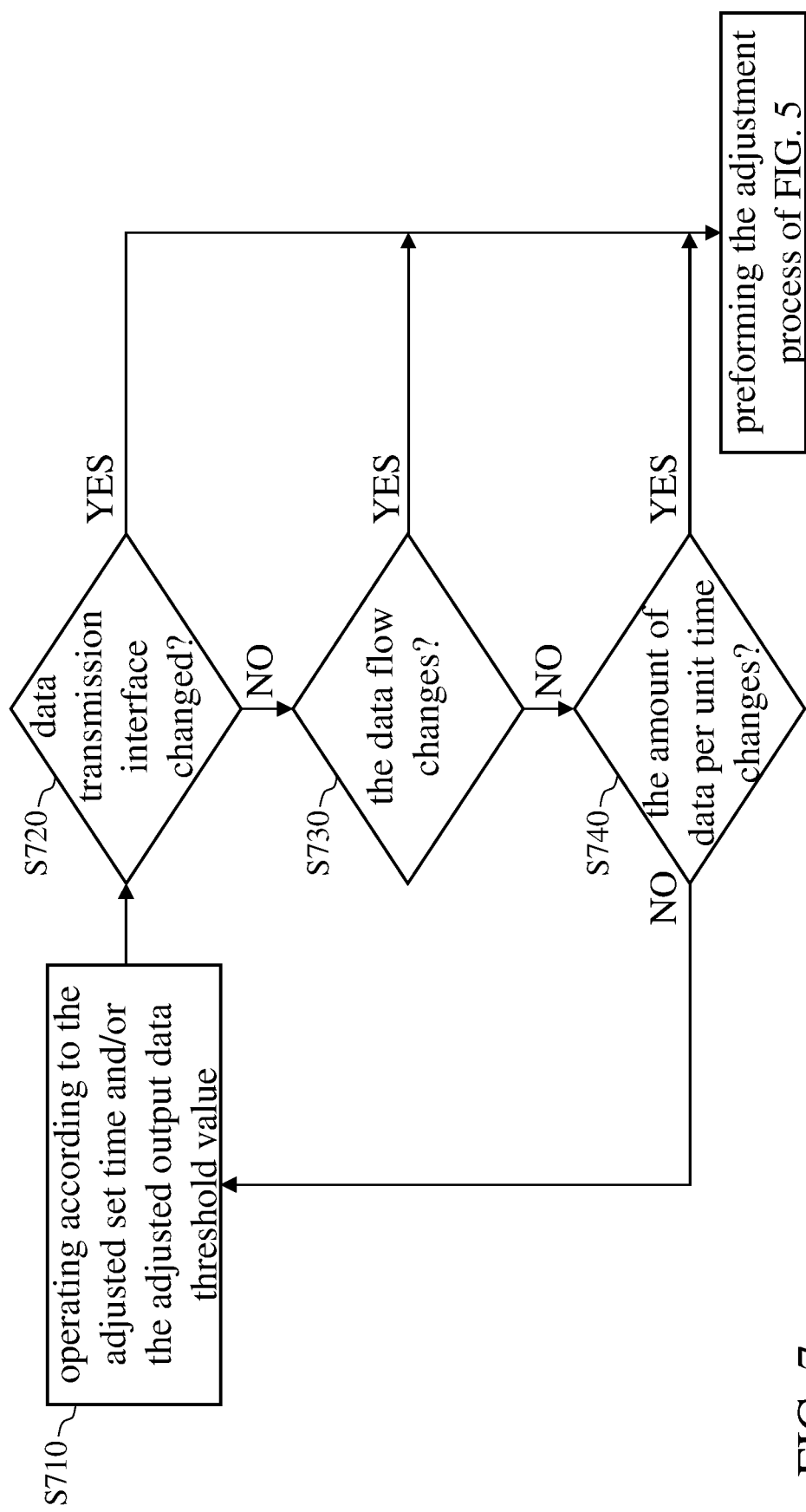
FIG. 7 illustrates a flowchart of an operation method of a data transceiver device according to an embodiment of this disclosure.

FIG. 7 is a flowchart of an operation method of a data transceiver device according to an embodiment of this disclosure. FIG. 7 illustrates several circumstances in which the data transceiver device 220 determines whether to perform the adaptive adjustment process again after the adaptive adjustment process has been completed (i.e., step S530 or step S560 of FIG. 5 finishes). After the adaptive adjustment is completed, the data transceiver device 220 operates according to the adjusted set time and/or the adjusted output data threshold value (step S710), namely, the data transceiver device 220 performs step S310 to step S370 in FIG. 3. When any of the following three conditions is met, the control circuit 221 performs the adjustment process of FIG. 5 again: (1) the data transmission interface 230 is changed (step S720); (2) the data flow of the output data Dout and/or the input data Din changes (step S730); or (3) the amount of the output data Dout and/or the input data Din per unit time changes (step S740). The examples of condition (1) may be that the data transmission interface 230 changes from the first version of a certain type of transmission interface to the second version (e.g., from USB 2.0 to USB 3.0), or that the data transmission interface 230 changes from a certain type of transmission interface to another type of transmission interface (e.g., from USB to SDIO). The examples of condition (2) may be that the output data Dout and/or the input data Din change from a large amount of data to a small amount of data, or vice versa. The examples of condition (3) may be that the amount of the output data Dout and/or the input data Din per unit time changes, for example, from dense data to loose data, or vice versa. The circumstances illustrated in FIG. 7 are for the purpose of illustrating this disclosure by way of examples, not for limiting the conditions for restarting the adaptive adjustment process in this disclosure. The order of step S710, step S720 and step S730 is not limited to the order shown in FIG. 7.

Figure 8:
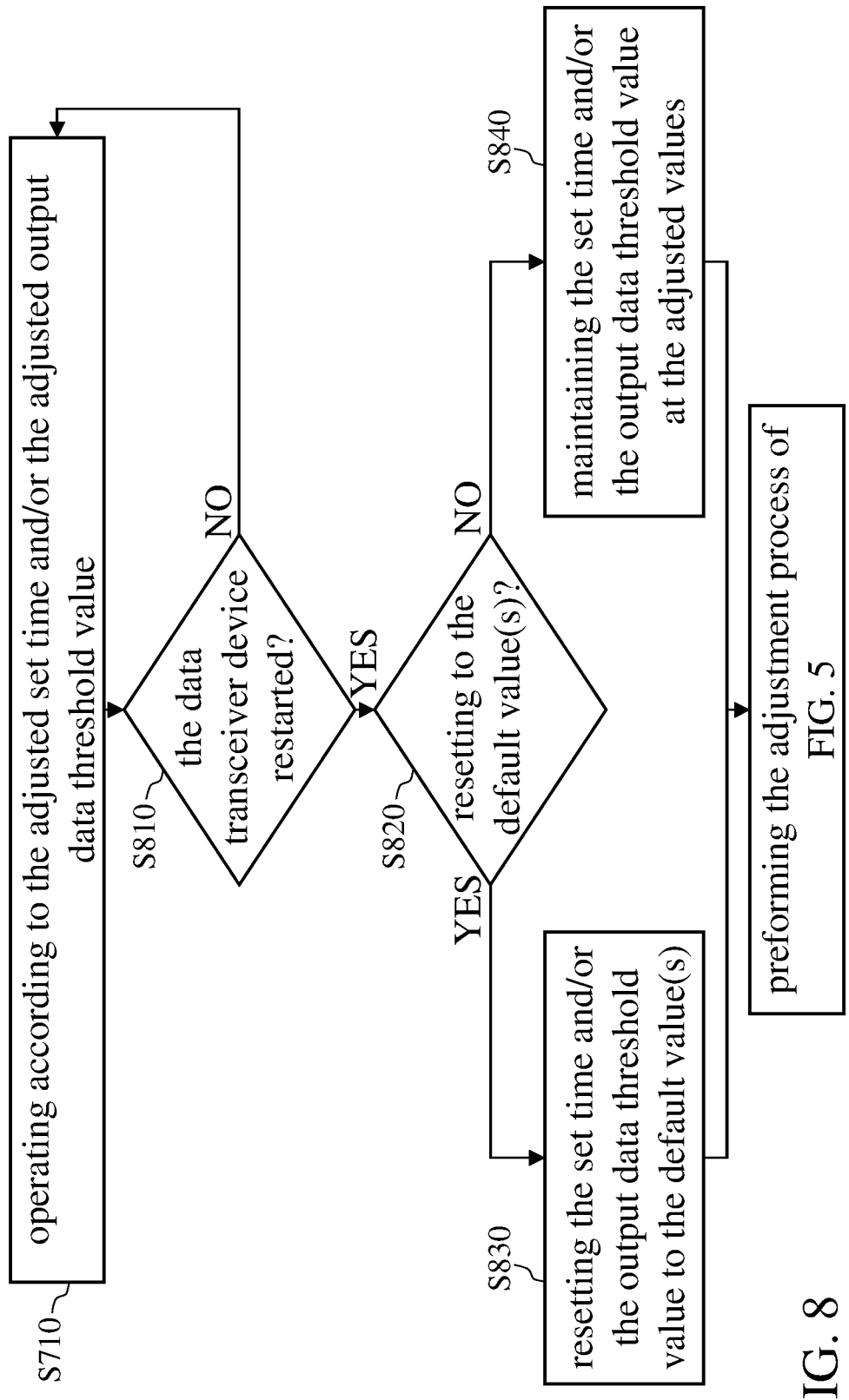
FIG. 8 illustrates a flowchart of an operation method of a data transceiver device according to an embodiment of this disclosure.

FIG. 8 is a flowchart of an operation method of a data transceiver device according to an embodiment of this disclosure. FIG. 8 illustrates the restart of the data transceiver device 220 after the adaptive adjustment process is completed (i.e., step S530 or step S560 of FIG. 5 finishes). After the adaptive adjustment is completed and before the data transceiver device 220 is restarted (i.e., step S810 being determined negative), the data transceiver device 220 operates according to the adjusted set time and/or the adjusted output data threshold value (step S710). When the data transceiver device 220 is restarted (YES branch in step S810), the control circuit 221 determines whether to reset the set time and/or the output data threshold value to the default value(s) (step S820). When step S820 is positive, the control circuit 221 resets the set time and/or the output data threshold value to the default value(s) (step S830), and then performs the adjustment process of FIG. 5 again. When step S820 is negative, the control circuit 221 maintains the set time and/or the output data threshold value at their respective adjusted values (step S840), and then performs the adjustment process of FIG. 5 again.

In some embodiments, when the data transceiver device 220 is restarted (YES branch in step S810), the flow can go to the flow of FIG. 3, that is, performing steps S310 to S370 in FIG. 3.

In some embodiments, the control circuit 221 may be a circuit or an electronic component with program execution capability, such as a central processing unit (CPU), microprocessor, or micro-processing unit. The control circuit 221 executes the program code or program instructions stored in the memory 222 to perform the steps in FIGS. 3 to 8. In other embodiments, people having ordinary skill in the art can design the control circuit 221 according to the above disclosure, that is, the control circuit 221 can be an application specific integrated circuit (ASIC) or implemented by circuits or hardware such as a programmable logic device (PLD).

The control circuit 221 can perform the adjustment process of FIG. 5 when the data transceiver device 220 is either in a working state or in a suspend state. When the data transceiver device 220 is in the suspend state, the control circuit 221 can still receive the input data Din and transmit the output data Dout. The control circuit 221 can perform the adjustment process in FIG. 5 regardless of whether the host 210 is in the working state or the suspend state.

In some embodiments, the timing circuit 223 is a counter that operates according to the system clock of the electronic device 200, and issues a time-out signal and resets the count value when the count value reaches the target value. Adjusting the set time is equivalent to adjusting the target value of the counter.

In some embodiments, when the data transceiver device 220 is a NIC, the control circuit 221, in the adjustment process of FIG. 5, adjusts the pause packet transmission timing parameter (namely, adjusts the start timing of the pause packets) based on the initial conditions and the state of the buffer circuit 224. More specifically, in the process of the self-adaptive adjustment, a demand for the increase in the set time and/or the output data threshold value often suggests an excessive data flow (exceeding the capacity of the buffer circuit 224). In other words, if the set time and/or the output data threshold value need(s) to be increased and have/has met their respective boundary conditions, the control circuit 221 slows down the flow rate of the transmission device on the opposite side (i.e., the device that transmits the input data Din, not shown) by lengthening the waiting condition of the object to which the final pause packet is transmitted or by continuously transmitting the pause packets. If the original setting is that the control circuit 221 issues a pause packet when the buffer circuit 224 does not have enough space to receive more packets, in the condition that the set time and/or the output data threshold value have/has met the boundary condition, the control circuit 221 lengthens the time for which the transmission device on the opposite side waits to receive the pause packet.

The above-mentioned data transceiver device which processes the network packets is intended to illustrate this disclosure by way of examples, rather than to limit the scope of this disclosure. People having ordinary skill in the art can apply this disclosure to other types of data transceiver devices according to the embodiments discussed above.

Since a person having ordinary skill in the art can appreciate the implementation detail and the modification thereto of the present method embodiment through the disclosure of the device embodiment, repeated and redundant description is thus omitted. Please note that there is no step sequence limitation for the method embodiments as long as the execution of each step is applicable. Furthermore, the shape, size, and ratio of any element and the step sequence of any flow chart in the disclosed figures are exemplary for understanding, not for limiting the scope of this disclosure.

The aforementioned descriptions represent merely the preferred embodiments of this disclosure, without any intention to limit the scope of this disclosure thereto. Various equivalent changes, alterations, or modifications based on the claims of this disclosure are all consequently viewed as being embraced by the scope of this disclosure.

What is claimed is:

1. A data transceiver device for receiving an input data and transmitting an output data, comprising:
   a buffer circuit configured to store the input data;
   a storage circuit configured to store the output data;
   a timing circuit configured to generate a time-out signal based on a set time; and
   a control circuit configured to process the input data to generate the output data and to transmit the generated output data based on an output data threshold value and the time-out signal;
   wherein the control circuit adjusts the set time and/or the output data threshold value based on an initial condition and a state of the buffer circuit;
   wherein the initial condition is selected from a group comprising a type of a data transmission interface, whether there is a hub on the data transmission interface, a data flow of the output data, amount of the output data per unit time, a data flow of the input data, and amount of the input data per unit time, and the state of the buffer circuit is a size of remaining or available space of the buffer circuit and/or whether the size of the remaining or available space of the buffer circuit is less than or greater than a threshold value.

2. The data transceiver device of claim 1, wherein the control circuit further determines whether to stop adjusting the set time and/or the output data threshold value based on a boundary condition.

3. The data transceiver device of claim 2, wherein the data transceiver device transmits the output data to a host, and the initial condition and the boundary condition are provided by the host.

4. The data transceiver device of claim 3, wherein the data transceiver device is coupled to the host through the data transmission interface, and the initial condition and/or the boundary condition are/is related to the type of the data transmission interface.

5. The data transceiver device of claim 3, wherein the initial condition and/or the boundary condition are/is related to the data flow of the output data and/or the input data and/or to the amount of the output data and/or the input data per unit time.

6. The data transceiver device of claim 3, wherein the host controls the control circuit to stop adjusting the set time and/or the output data threshold value before the boundary condition is met.

7. The data transceiver device of claim 3, wherein the control circuit stops adjusting the set time and/or the output data threshold value before the boundary condition is met.

8. The data transceiver device of claim 7, wherein the control circuit stops adjusting the set time and/or the output data threshold value after a target time has elapsed.

9. The data transceiver device of claim 2, wherein when the set time and/or the output data threshold value meet(s) the boundary condition, the control circuit stops adjusting the set time and/or the output data threshold value.

10. The data transceiver device of claim 9, wherein the control circuit uses a default value as the set time and/or the output data threshold value and sets the set time and/or the output data threshold value to the default value after stopping adjusting the set time and/or the output data threshold value.

11. The data transceiver device of claim 9, wherein the control circuit uses the boundary condition to set the set time and/or the output data threshold value after stopping adjusting the set time and/or the output data threshold value.

12. The data transceiver device of claim 2, wherein when adjusting the set time and/or the output data threshold value, the control circuit increases or decreases the set time and/or the output data threshold value.

13. The data transceiver device of claim 1, wherein the control circuit adjusts the set time and/or the output data threshold value when the data transceiver device is in a suspend state or a working state.

14. The data transceiver device of claim 1, wherein the control circuit has program execution capability and comprises a memory, the memory stores a plurality of program instructions, and the control circuit executes the program instructions to adjust the set time and/or the output data threshold value based on the initial condition and the state of the buffer circuit.

15. The data transceiver device of claim 1, wherein the data transceiver device is coupled to a host through the data transmission interface, and when the data transmission interface changes, the control circuit adjusts the set time and/or the output data threshold value based on the initial condition and the state of the buffer circuit.

16. The data transceiver device of claim 1, wherein the control circuit adjusts the set time and/or the output data threshold value based on the initial condition and the state of the buffer circuit when at least one of following properties changes: the output data, the data flow of the input data and data amount per unit time.

17. The data transceiver device of claim 1, wherein the control circuit uses a default value as the set time and/or the output data threshold value, and when the data transceiver device is restarted, the control circuit resets the set time and/or the output data threshold value to the default value, and adjusts the set time and/or the output data threshold value based on the initial condition and the state of the buffer circuit.

18. The data transceiver device of claim 1, wherein when the control circuit finishes adjusting the set time and/or the output data threshold value, the set time and/or the output data threshold value are/is adjusted value(s), and after the data transceiver device is restarted, the control circuit adjusts the set time and/or the output data threshold value again based on the initial condition, the state of the buffer circuit and the adjusted value(s).

19. An operation method of a data transceiver device, wherein the data transceiver device comprises a buffer circuit and a storage circuit, the operation method comprising steps of:
  receiving an input data and storing the input data in the buffer circuit;
  processing the input data to generate an output data;
  storing the output data in the storage circuit;
  generating a time-out signal based on a set time;
  transmitting the output data based on an output data threshold value and the time-out signal; and
  adjusting the set time and/or the output data threshold value based on an initial condition and a state of the buffer circuit;
  wherein the initial condition is selected from a group comprising a type of a data transmission interface, whether there is a hub on the data transmission interface, a data flow of the output data, amount of the output data per unit time, a data flow of the input data, and amount of the input data per unit time, and the state of the buffer circuit is a size of remaining or available space of the buffer circuit and/or whether the size of the remaining or available space of the buffer circuit is less than or greater than a threshold value.

* * * * *